(12) United States Patent
Brown et al.

(10) Patent No.: US 7,658,621 B2
(45) Date of Patent: Feb. 9, 2010

(54) CONNECTOR ASSEMBLY HAVING CONNECTING DEVICE

(75) Inventors: Robert W. Brown, Harrisburg, PA (US); Tod M. Harlan, Mechanicsburg, PA (US); Kevin E. Walker, Hershey, PA (US); Terrance F. Little, York, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/148,273

(22) Filed: Apr. 17, 2008

(65) Prior Publication Data

US 2009/0263989 A1    Oct. 22, 2009

(51) Int. Cl.
*H01R 12/00*   (2006.01)
(52) U.S. Cl. .......................................... 439/74
(58) Field of Classification Search ............. 439/74, 439/75
See application file for complete search history.

(56) References Cited

U.S. PATENT DOCUMENTS

| | | | |
|---|---|---|---|
| 4,929,185 A * | 5/1990 | Wong et al. ................. | 439/74 |
| 5,059,130 A * | 10/1991 | Miller, Jr. .................... | 439/74 |
| 5,176,526 A * | 1/1993 | Hillbish et al. .............. | 439/108 |
| 5,575,686 A * | 11/1996 | Noschese ................. | 439/620.21 |
| 5,915,975 A * | 6/1999 | McGrath ..................... | 439/74 |
| 6,201,709 B1 * | 3/2001 | Justiniano et al. .......... | 361/790 |
| 6,273,730 B1 * | 8/2001 | Chang .......................... | 439/61 |
| 6,409,526 B1 * | 6/2002 | Malone et al. ............... | 439/160 |
| 6,431,879 B2 * | 8/2002 | Brekosky et al. ............ | 439/74 |
| 6,546,618 B1 | 4/2003 | Yagawa | |
| 7,223,106 B2 * | 5/2007 | Nakajima et al. ........... | 439/74 |
| 7,403,397 B2 * | 7/2008 | Matsumoto et al. ......... | 361/792 |
| 7,432,702 B2 * | 10/2008 | Shiao et al. ................. | 324/158.1 |
| 2002/0037656 A1 * | 3/2002 | Murakami ................... | 439/74 |
| 2002/0196614 A1 * | 12/2002 | DiBene et al. .............. | 361/803 |
| 2002/0197892 A1 * | 12/2002 | Allen et al. .................. | 439/74 |
| 2003/0232522 A1 * | 12/2003 | Buondelmonte et al. ..... | 439/74 |
| 2007/0249187 A1 * | 10/2007 | Chen ............................ | 439/74 |

* cited by examiner

*Primary Examiner*—T C Patel
*Assistant Examiner*—Vladimir Imas
(74) *Attorney, Agent, or Firm*—Ming Chieh Chang; Wei Te Chung; Andrew C. Cheng

(57) ABSTRACT

A connector assembly (100) includes a mother board (12), a mother receptacle (11), a daughter board (22), a daughter receptacle (21), and a connecting device (30) mounted between said two boards. The connecting device includes a shroud (31), a pair of standoffs (32) mounted at opposite sides of the shroud and engageable with the two boards, and an extender (33) positioned alongside the shroud and between the pair of standoffs. The extender defines a lower interface (332) mating with the mother receptacle and an upper interface (331) mating with the daughter receptacle.

18 Claims, 5 Drawing Sheets

CONNECTOR ASSEMBLY HAVING CONNECTING DEVICE

BACKGROUND OF THE INVENTION

1. Field of the Invention

The present invention relates to a connector assembly, and particularly to a connector assembly having a connecting device between a pair of separated circuit boards.

2. Description of Related Art

Conventional board-to-board connector assembly has a plurality of standard commercial hexagonal rivets positioned between an upper circuit board and a lower circuit board for supporting the upper circuit board from the lower circuit board and maintaining a certain distance between the two separated circuit boards. The rivet has opposite ends respectively engaging with the pair of separated circuit boards.

When an unpackaged drop test is performed on the connector assembly, the rivets may be not mechanically strong enough to withstand the strong pressing force produced from the drop test. The connection between the two circuit boards has been broken finally.

Hence, an improved connector assembly is required to overcome the above-mentioned disadvantages of the related art.

SUMMARY OF THE INVENTION

An object of the present invention is to provide a connector assembly having a reinforced connecting device for providing a reliable connection between a pair of separated circuit boards.

To achieve the aforementioned objects, a connector assembly comprises a mother board, a mother receptacle mounted on the mother board, a daughter board, a daughter receptacle mounted on the daughter board, and a connecting device mounted between said two boards. The connecting device includes a shroud, a pair of standoffs mounted at opposite sides of the shroud and engageable with the two boards, and an extender positioned alongside the shroud and between the pair of standoffs. The extender defines a lower interface mating with the mother receptacle and an upper interface mating with the daughter receptacle.

The shroud device could be designed with a proper height to separate the daughter board from the mother board at a required distance. Additionally, the connecting device is reinforced as a rigid strengthened structure by integrating the shroud, the standoffs and the extender as a single piece. The connecting device is thus capable of providing a reliable connection between the mother board and the daughter board. Therefore, the mother board and the daughter board could be restricted from shifting with respect to each other during an unpackaged drop test to meet the requirement of the customer.

Other objects, advantages and novel features of the invention will become more apparent from the following detailed description of a preferred embodiment when taken in conjunction with the accompanying drawings.

DETAILED DESCRIPTION OF THE INVENTION

Figure 1:
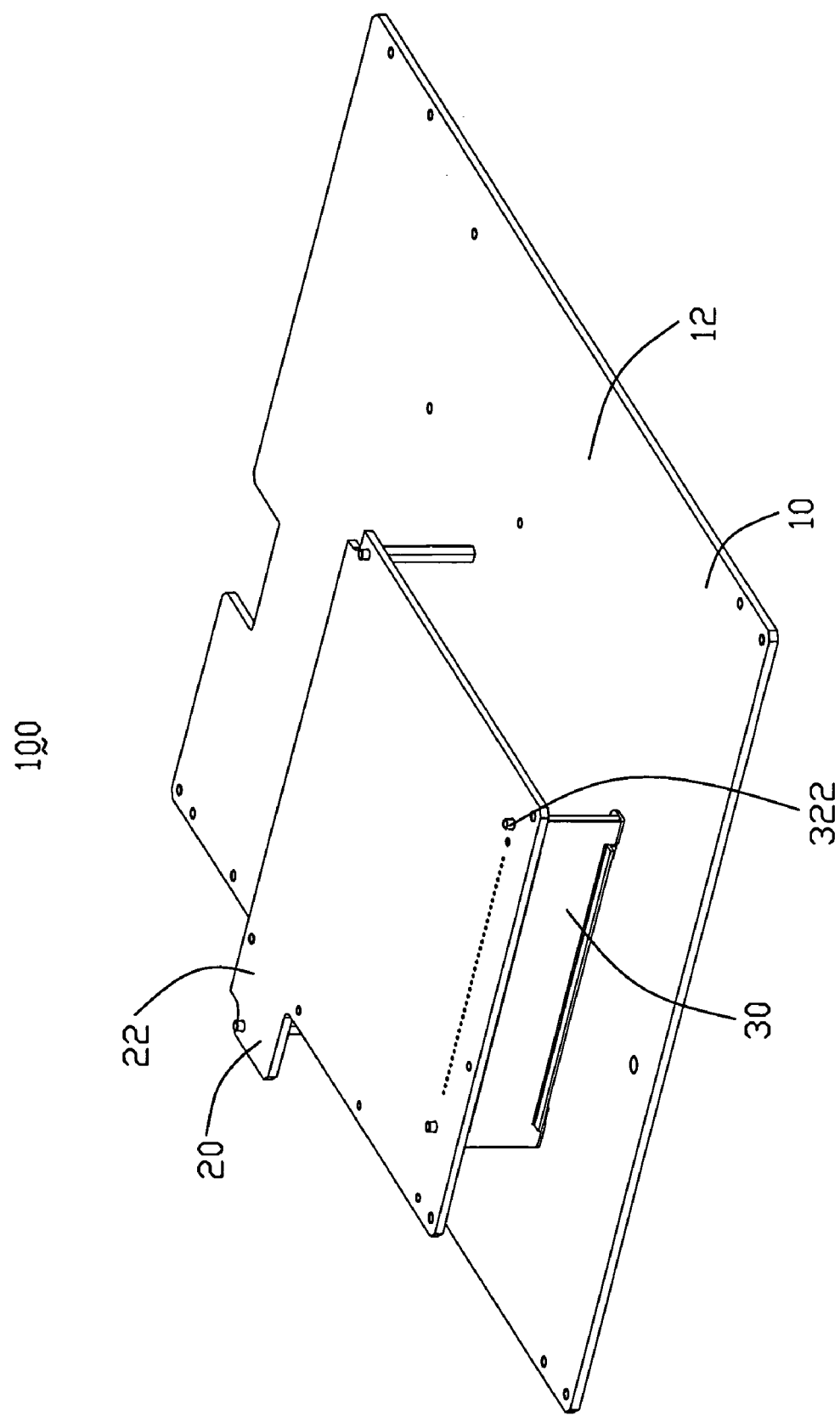
FIG. 1 is an assembled perspective view of a connector assembly in accordance with the present invention.
Figure 2:
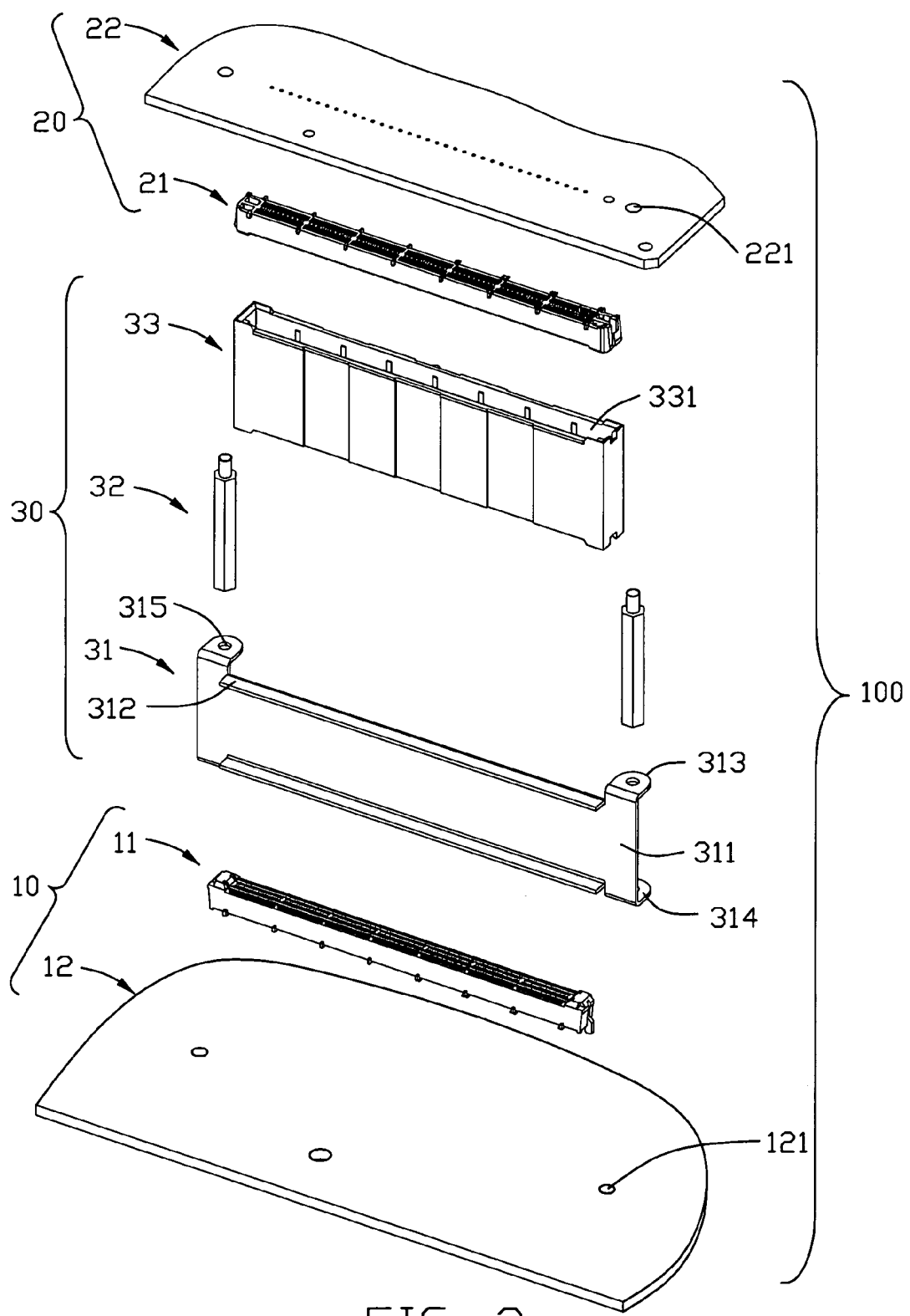
FIG. 2 is an exploded perspective view of the connector assembly as shown in FIG. 1.

Reference will now be made to the drawing figures to describe the present invention in detail. Referring to FIGS. 1-2, a connector assembly 100 in accordance with the preferred embodiment of the present invention comprises a mother system 10, a daughter system 20 and a connecting device 30. The mother system 10 comprises a mother board 12 and a mother receptacle 11 mounted on the mother board 12. The daughter system 20 comprises a daughter board 22 and a daughter receptacle 21 mounted on the daughter board 22. The connecting device 30 is disposed between the mother board 12 and the daughter board 22.

Figure 3:
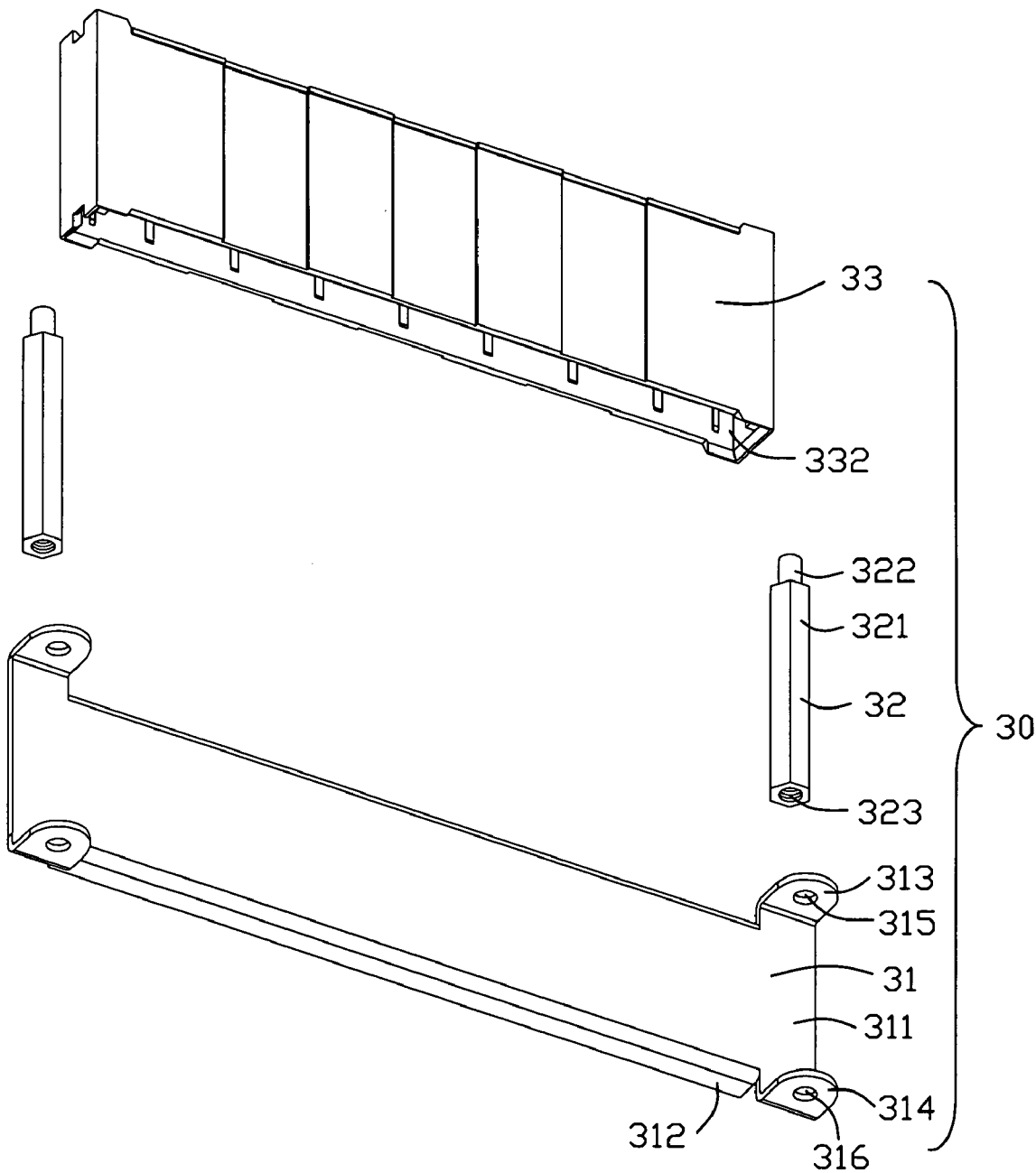
FIG. 3 is an exploded perspective view of a connecting device as shown in the FIG. 2.
Figure 4:
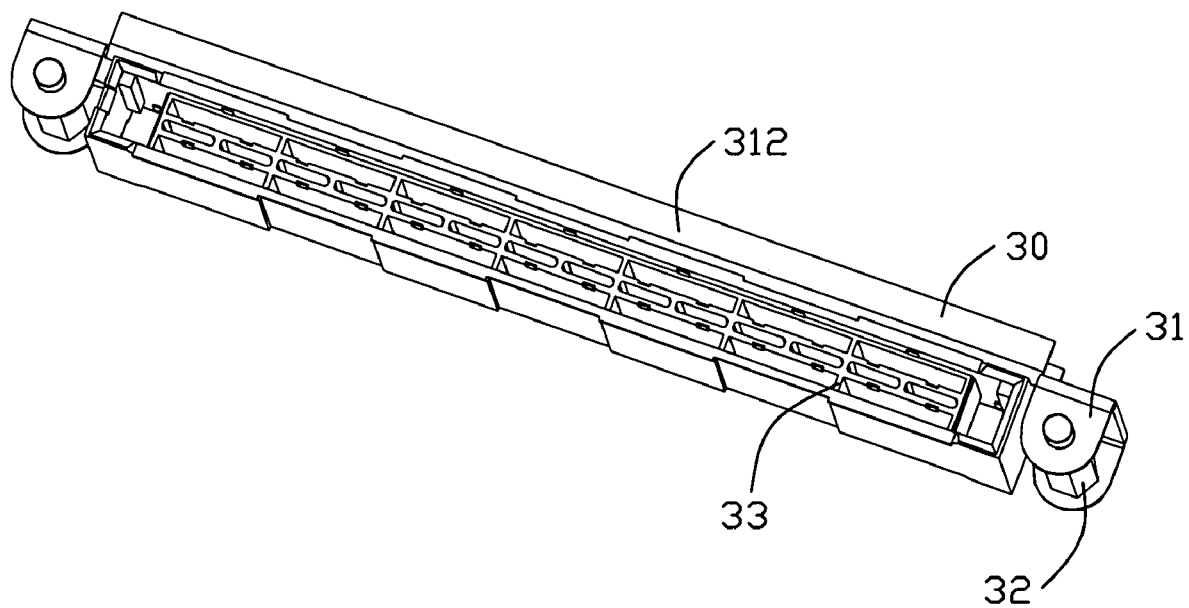
FIG. 4 is a partially assembled perspective view of the connecting device as shown in FIG. 3.

Referring to FIGS. 2-4, the connecting device 30 comprises a shroud 31 and a pair of standoffs 32 assembled as a supporting device 34, an extender 33 positioned to the supporting device 34, and a plurality of screws (not shown). The shroud 31 has a substantially rectangular body portion 311, a pair of symmetrically formed flanges 312 projecting forwardly from upper and lower edges of the body portion 311 for strengthening the connecting device 30, a pair of upper tabs 313 and a pair of lower tabs 314 respectively extending rearwardly from upper and lower corners of the body portion 311. The upper tab 313 and the lower tab 314 respectively has an upper mounting hole 315 and a lower mounting hole 316 defined thereon.

Referring to FIG. 3, the standoff 32 comprises a hexagonal post portion 321, a threaded post 322 extending upwardly from the post portion 321, and a tapped hole 323 defined at a bottom of the post portion 321. The post portion 321 has a diameter greater than that of the threaded post 322. Optionally, the post portion 321 could be configured as a cylindrical post and etc.

Referring to FIGS. 2-3, the rectangular extender 33 has an upper interface 331 and a lower interface 332 opposite to the upper interface 331. The extender 33 has a pair of contact modules (not shown) disposed therein. Each contact module has a lower end and an upper end respectively adapted for mating with the mother receptacle 11 and the daughter receptacle 21.

Referring to FIG. 2, the mother board 12 defines a pair of first fixing holes 121 through the mother board 12. The daughter board 22 defines a pair of second fixing holes 221 through the daughter board 22.

Referring to FIGS. 2-4, in assembly of the supporting device 34, the pair of standoffs 32 are assembled to opposite sides of the shroud 31. Each standoff 32 is mounted between the upper tab 313 and corresponding lower tab 314, with the threaded post 322 inserting through the upper mounting hole 315 of the upper tab 313, and with the taped hole 323 aligned with the lower mounting hole 316 of the lower tab 314. In assembly of the connecting device 30, the extender 33 is mounted alongside the shroud 31 and between the pair of standoffs 32.

Figure 5:
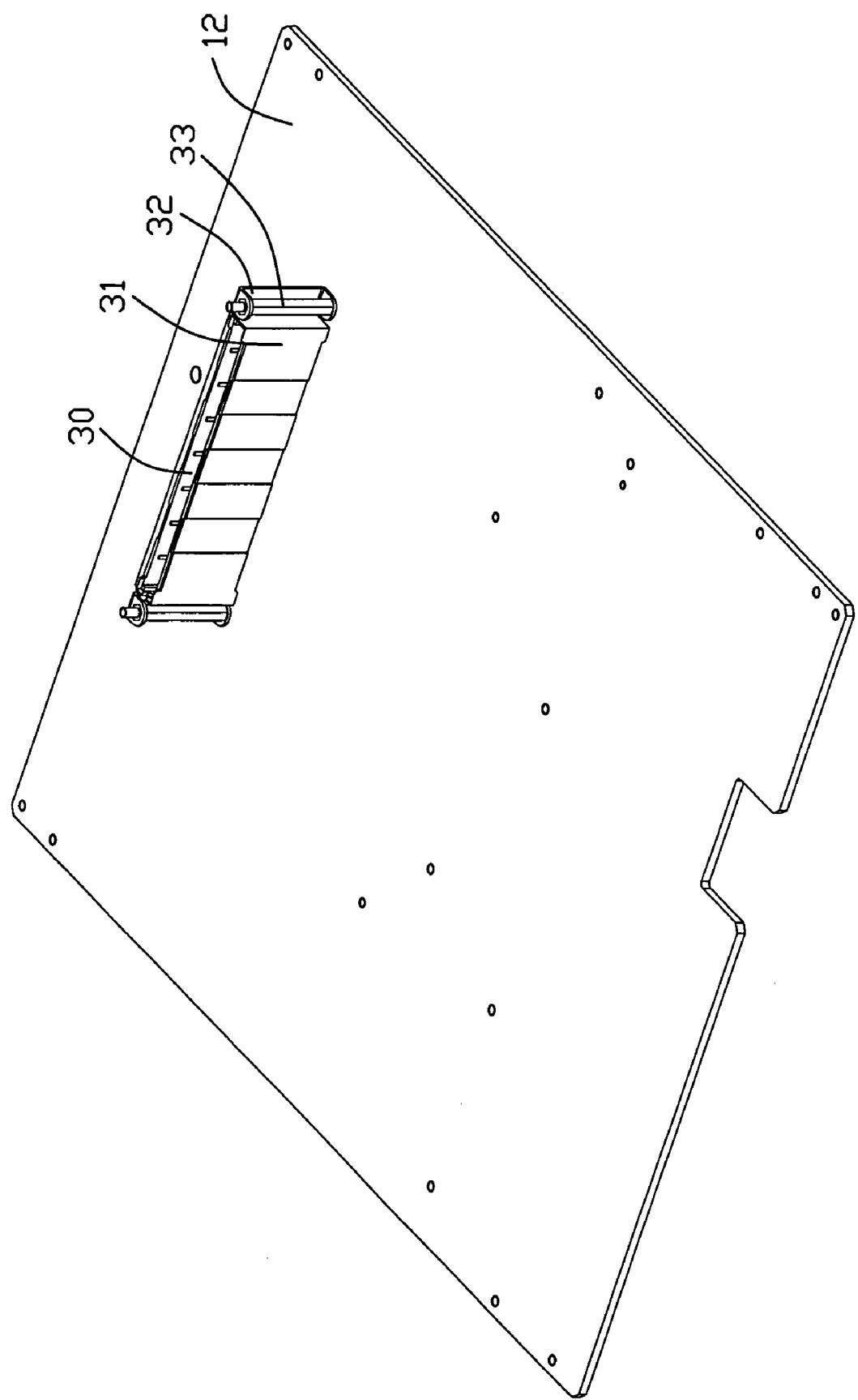
FIG. 5 is perspective view showing the connecting device mounted on a mother board.

In conjunction with FIG. 5, the connecting device 30 is mounted on the mother board 12 firstly, with the mother receptacle 11 mating with the lower interface 332 of the extender 33. The connecting device 30 is fastened to the mother board 12, via a pair of screws each inserted through the first fixing hole 121 of the mother board 12 into the lower mounting hole 316 of the lower tab 314 and engaging with the tapped hole 323 of the standoff 32.

Referring to FIG. 1, the daughter board 22 together with the daughter receptacle 21 is then mated with the connecting device 30, with the daughter receptacle 21 mating with the upper interface 331 of the extender 33 and the threaded post 322 inserting outward the daughter board 22 via the second fixing hole 221. The connecting device 30 is fastened to the daughter board 22, via a pair of nuts (not shown) each engaging with the inserted threaded post 322. In conjunction with FIGS. 4-5, the mother board 12 together with the mother receptacle 11 and the daughter board 22 together with the daughter receptacle 21 are electrically connected with each other, via the contact modules disposed adjacent to the lower and upper interfaces 332, 331 for mating with the mother and daughter receptacles 11, 21.

The supporting device 34 could be designed with a proper height to separate the daughter board 22 from the mother board 12 at a required distance. Additionally, the connecting device 30 is reinforced as a rigid strengthened structure by integrating the shroud 31, the standoffs 32 and the extender 33 as a single piece. Thus, the connecting device 30 is capable of providing a reliable connection between the mother board 12 and the daughter board 11. Therefore, the mother board 12 and the daughter board 22 are restricted from shifting with respect to each other during an unpackaged drop test to meet the requirement of the customer.

However, the disclosure is illustrative only, changes may be made in detail, especially in matter of shape, size, and arrangement of parts within the principles of the invention.

What is claimed is:

1. A connector assembly comprising:
   a mother board and a mother receptacle mounted on the mother board;
   a daughter board and a daughter receptacle mounted on the daughter board; and
   a connecting device mounted between said two boards and comprising a shroud, a pair of standoffs mounted at opposite sides of the shroud and engageable with said two boards, and an extender positioned alongside the shroud and between the pair of standoffs, wherein said extender defines a lower interface mating with the mother receptacle and an upper interface mating with the daughter receptacle, each standoff having a tapped hole defined at a bottom thereof, said shroud having a pair of lower tabs each defining a lower mounting hole aligned with the tapped hole of the standoff.

2. The connector assembly as claimed in claim 1, said connecting device comprises a pair of screws each inserting through the mother board into the lower mounting hole and then engaging with the tapped hole of the standoff.

3. The connector assembly as claimed in claim 1, wherein said shroud has a pair of upper tabs each defining an upper mounting hole, and wherein each standoff is formed with a threaded post insertable through corresponding upper mounting hole of the shroud and through the daughter board.

4. The connector assembly as claimed in claim 3, wherein said connecting device is fastened to the daughter board via a pair of nuts each engageable with the threaded post of the standoff.

5. The connector assembly as claimed in claim 3, wherein said shroud comprises a rectangular body portion, the pair of upper tabs and the pair of lower tabs project toward the extender from four corners of the body portion.

6. The connector assembly as claimed in claim 5, wherein said body portion of the shroud has a pair of flanges extending from upper and lower edges thereof in a direction away from the extender.

7. The connector assembly as claimed in claim 1, wherein said extender retains therein a pair of contact modules each having opposite ends disposed adjacent to the lower and upper interfaces for mating with the mother and daughter receptacles.

8. A connecting device supportable between a mother system having a mother board and a daughter system having a daughter board, comprising:
   a shroud;
   a pair of standoffs mounted at opposite sides of the shroud and engageable to the mother board and the daughter board; and
   an extender positioned alongside the shroud between the pair of standoffs and retaining a pair of contact modules each having opposite ends in contact with the mother system and the daughter system, each standoff having a tapped hole defined at a bottom thereof, said shroud having a pair of lower tabs each defining a lower mounting hole aligned with the tapped hole of the standoff.

9. The connecting device as claimed in claim 8, said connecting device comprising a pair of screws each inserting through the mother board into the lower mounting hole and then engaging with the tapped hole of the standoff.

10. The connecting device as claimed in claim 8, wherein said shroud has a pair of upper tabs each defining an upper mounting hole, each standoff is formed with a threaded post insertable through corresponding upper mounting hole of the shroud and through the daughter board.

11. The connecting device as claimed in claim 10, wherein said connecting device is fastened to the daughter board via a pair of nuts each engageable with the threaded post of the standoff.

12. The connecting device as claimed in claim 10, wherein said shroud comprises a rectangular body portion, the pair of upper tabs and the pair of lower tabs project toward the extender from four corners of the body portion.

13. The connecting device as claimed in claim 12, wherein said body portion of the shroud has a pair of flanges extending from upper and lower edges thereof in a direction away from the extender.

14. The connecting device as claimed in claim 8, wherein said extender defines a lower interface mating with a mother receptacle mounted on the mother board, and an upper interface mating with a daughter receptacle mounted on the daughter board.

15. A connection system comprising:
    first and second printed circuit boards opposite to each other in a parallel relation;
    a first connector mounted upon one surface of the first printed circuit board;
    a second connector mounted upon one surface of the second printed circuit board facing to said first connector;
    a connection device defining opposite mating ports respectively coupled to the first and second connectors;
    a metallic structure dimensioned with a height similar to that of the connection device and including two pairs of tabs respectively seated upon the surface of the first printed circuit board and the surface of the second printed circuit board; and
    fastening devices mounting said mounting tabs to the corresponding surfaces.

16. The connection system as claimed in claim 15, wherein said fastening device is a rod having two ends respectively abutting against the two mounting tabs.

17. The connection system as claimed in claim 16, wherein said rod absorbs the forces from the printed circuit boards.

18. The connection system as claimed in claim 15, wherein said metallic structure shields at least one elongated side of said connection device.

* * * * *